(12) United States Patent
Zhang et al.

(10) Patent No.: US 12,087,875 B2
(45) Date of Patent: Sep. 10, 2024

(54) METHOD FOR MANUFACTURING PHOTOVOLTAIC (PV) MODULE

(71) Applicants: Jiangsu Coop&Inno Green Energy Technology Co., Ltd., Wuxi (CN); Wuxi Coop&Inno Green Energy Technology Co., Ltd., Wuxi (CN); WUXI DINGSENMAO TECHNOLOGY CO., LTD, Wuxi (CN)

(72) Inventors: Yujun Zhang, Suzhou (CN); Aibing Tao, Suzhou (CN); Jia Shen, Suzhou (CN)

(73) Assignees: Jiangsu Coop&Inno Green Energy Technology Co., Ltd., Wuxi (CN); Wuxi Coop&Inno Green Energy Technology Co., Ltd., Wuxi (CN); WUXI DINGSENMAO TECHNOLOGY CO., LTD, Wuxi (CN)

( * ) Notice: Subject to any disclaimer, the term of this patent is extended or adjusted under 35 U.S.C. 154(b) by 461 days.

(21) Appl. No.: 17/593,627

(22) PCT Filed: Dec. 19, 2019

(86) PCT No.: PCT/CN2019/126580
§ 371 (c)(1),
(2) Date: Sep. 22, 2021

(87) PCT Pub. No.: WO2020/199660
PCT Pub. Date: Oct. 8, 2020

(65) Prior Publication Data
US 2022/0165908 A1  May 26, 2022

(30) Foreign Application Priority Data
Mar. 29, 2019 (CN) .......................... 201910248480.6

(51) Int. Cl.
B23K 1/00 (2006.01)
B23K 31/12 (2006.01)
(Continued)

(52) U.S. Cl.
CPC ........ H01L 31/1876 (2013.01); B23K 1/0016 (2013.01); B23K 31/125 (2013.01); H01L 31/0504 (2013.01); H02S 50/15 (2014.12)

(58) Field of Classification Search
CPC ............. H01L 31/1876; H01L 31/0504; H01L 31/188; B23K 1/0016; B23K 1/0008; B23K 31/125; H02S 50/15
(Continued)

(56) References Cited

U.S. PATENT DOCUMENTS

2007/0169806 A1  7/2007  Fork et al.
2010/0047954 A1  2/2010  Su et al.
(Continued)

FOREIGN PATENT DOCUMENTS

CN  201413829 Y  2/2010
CN  102544242 A  7/2012
(Continued)

Primary Examiner — Kiley S Stoner
(74) Attorney, Agent, or Firm — Bayramoglu Law Offices LLC

(57) ABSTRACT

A method for manufacturing a photovoltaic (PV) module includes: using a stringer to simultaneously solder at least two cell strings, and soldering an interconnecting bar at a predetermined position; performing electroluminescence (EL) inspection and appearance inspection/photoluminescence (PL) inspection on cells in the at least two cell strings to obtain cell images and cell inspection results; automatically soldering bus bars at heads and tails of the cell strings; placing the cell modules on front plate glass in sequence, and marking a suspicious cell; when a cell that needs to be repaired exists in the cell modules, sending a repair instruc-
(Continued)

tion, and delivering the front plate glass of carrying the cell modules to a repair workstation; at a stacking workstation, soldering together bus bars at tails of two adjacent cell modules; and performing EL inspection and appearance inspection/PL inspection.

12 Claims, 7 Drawing Sheets

(51) Int. Cl.
  *H01L 31/05* (2014.01)
  *H01L 31/18* (2006.01)
  *H02S 50/15* (2014.01)
(58) Field of Classification Search
  USPC ....... 228/8–12, 102–105, 119, 179.1–180.21
  See application file for complete search history.

(56) References Cited

U.S. PATENT DOCUMENTS

| | | | |
|---|---|---|---|
| 2010/0240153 A1* | 9/2010 | Tabe | H01L 31/188 |
| | | | 438/4 |
| 2014/0043056 A1* | 2/2014 | Baba | H01L 22/34 |
| | | | 324/761.01 |
| 2018/0159469 A1* | 6/2018 | Trupke | H02S 50/15 |
| 2019/0089301 A1* | 3/2019 | Collins | H02S 50/15 |
| 2019/0296171 A1* | 9/2019 | Chang | H01L 31/02008 |
| 2019/0331602 A1* | 10/2019 | Hobbs, Jr. | G01N 21/63 |

FOREIGN PATENT DOCUMENTS

| | | | | |
|---|---|---|---|---|
| CN | 102800761 A | | 11/2012 | |
| CN | 103372698 A | | 10/2013 | |
| CN | 104465861 A | | 3/2015 | |
| CN | 205621752 U | | 10/2016 | |
| CN | 106229381 A | | 12/2016 | |
| CN | 106862811 A | | 6/2017 | |
| CN | 106935684 A | | 7/2017 | |
| CN | 107256908 A | | 10/2017 | |
| CN | 107508548 A | | 12/2017 | |
| CN | 107623049 A | | 1/2018 | |
| CN | 207116448 U | | 3/2018 | |
| CN | 107914093 A | | 4/2018 | |
| CN | 208231119 U | | 12/2018 | |
| CN | 109285905 A | | 1/2019 | |
| CN | 109390424 A | * | 2/2019 | ......... H01L 31/0481 |
| CN | 109411566 A | | 3/2019 | |
| CN | 109950362 A | | 6/2019 | |
| CN | 107534414 B | * | 11/2019 | ............. G01N 21/63 |
| CN | 110459637 A | * | 11/2019 | ............ H01L 31/044 |
| CN | 110535435 A | * | 12/2019 | ............ G06T 7/0002 |
| EP | 2752888 A1 | * | 7/2014 | ..... H01L 31/022441 |
| JP | 2008053625 A | | 3/2008 | |
| JP | 2011187601 A | | 9/2011 | |
| JP | 2012143805 A | | 8/2012 | |
| JP | 2015005574 A | | 1/2015 | |
| KR | 100962291 B1 | * | 6/2010 | |
| KR | 101806971 B1 | | 1/2018 | |
| WO | WO-2010134467 A1 | * | 11/2010 | ..... H01L 31/022425 |
| WO | 2017117136 A1 | | 7/2017 | |
| WO | WO-2018079657 A1 | * | 5/2018 | ............. G01N 21/95 |

* cited by examiner

METHOD FOR MANUFACTURING PHOTOVOLTAIC (PV) MODULE

CROSS REFERENCE TO THE RELATED APPLICATIONS

This application is the national phase entry of International Application No. PCT/CN2019/126580, filed on Dec. 19, 2019, which is based upon and claims priority to Chinese Patent Application No. 201910248480.6, filed on Mar. 29, 2019, the entire contents of which are incorporated herein by reference.

TECHNICAL FIELD

Embodiments of the present invention relate to the field of photovoltaic (PV) module manufacturing, and more particularly, to a method for manufacturing a PV module.

BACKGROUND

With the rise of energy prices, the development and utilization of new energy sources has become the main topic of research in the energy field today. Since solar energy has the advantages of no pollution, no territorial restriction, inexhaustibility and the like, solar power generation has become the main direction for the development and utilization of new energy sources. Using solar cells to generate electricity is a major way for humans to utilize solar energy today.

A stringer of a typical PV module stringing workstation can only produce one cell string, which has low efficiency; and thus, a plurality of stringers need to be purchased for one production line to match the subsequent process devices. Moreover, after stringing, an independent layout process, a tape sticking process for fixing a string, and a process for soldering bus bars and lead-out wires are required, and these processes all require additional devices or manual actions and also consume a lot of space and capital resources. In addition, abnormalities in a stringing process need to be checked by workers online, otherwise, it is impossible to determine whether there are batch defects or severe defects timely and actual locations of the defects. The total dependence of on-line manual random inspection and marking causes the very low speed and efficiency. For typical PV modules, appearance and electroluminescence (EL) inspections are performed after a backside adhesive film and a backside board are laid by workers. If a micro issue occurs during the stringing process and is found late, a large number of defective products will be produced, which causes substantial waste of labor for repair and also leads to material waste.

SUMMARY

Technical Problem

Abnormalities in a manufacturing process need to be checked by workers online, otherwise, it is impossible to determine whether there are batch defects or severe defects timely and actual locations of the defects. The total dependence on on-line manual random inspection and marking results in very low speed and efficiency.

Technical Solutions

A method for manufacturing a PV module is provided, including:

at a stringing workstation, using a stringer to simultaneously solder at least two cell strings, and during a cell soldering process, soldering an interconnecting bar at a predetermined position, where the interconnecting bar is configured to connect the at least two cell strings in parallel;

at the stringing workstation, performing an inspection on cells in the at least two cell strings to obtain cell images and cell inspection results, where the cell inspection results are used to determine whether a cell needs to be repaired, where the inspection includes an EL inspection and an appearance inspection or the inspection includes the EL inspection, a photoluminescence (PL) inspection and the appearance inspection;

sending information of a cell that needs to be repaired to a repair workstation;

automatically soldering bus bars at heads and tails of the at least two cell strings and soldering a lead-out wire on a bus bar at a head to form a cell module, where the bus bars are configured to connect the heads and the tails of the at least two cell strings in parallel;

placing cell modules on front plate glass in sequence, and marking the cell that needs to be repaired;

determining whether the cell that needs to be repaired exists in the cell modules; if a defective cell that needs to be repaired exists in the cell modules, sending a repair procedure instruction, and delivering the front plate glass of carrying the cell modules to the repair workstation according to the repair instruction; and if the cell that needs to be repaired does not exist in the cell modules, delivering the front plate glass of carrying the cell modules to a stacking workstation;

at the stacking workstation, soldering together bus bars at tails of two adjacent cell modules;

laying a backside adhesive film and a backside board; and before laminating, performing the EL inspection and the appearance inspection.

Optionally, the step of performing the inspection on the at least two cell strings may include:

in a cell string soldering process, when the $n^{th}$ cell is soldered, inspecting previous n−1 cells on each cell string, where n is an integer.

Optionally, the step of performing the inspection on the at least two cell strings may include:

in a cell string soldering process, after an $n^{th}$ interconnecting bar is soldered, inspecting cells between an $(n-1)^{th}$ interconnecting bar and the $n^{th}$ interconnecting bar and a cell where the $n^{th}$ interconnecting bar is located.

Optionally, the step of marking the cell that needs to be repaired may include:

after the cell modules are placed on the front plate glass in sequence, marking a back side of the cell that needs to be repaired;

or, before the cell modules are placed on the front plate glass in sequence, marking a back side of the cell that needs to be repaired.

Optionally, the cells in the cell strings may be any one from the group consisting of whole cells, ½ cells, ⅓ cells, ¼ cells, ⅕ cells, and ⅙ cells.

Optionally, the step of soldering together the bus bars at the tails of the two adjacent cell modules at the stacking workstation may include:

at the stacking workstation, soldering together the bus bars at the tails of the two adjacent cell modules by a tail worker.

Optionally, the method may further include laminating, trimming, the EL inspection, frame mounting, junction box mounting, curing, luminous efficiency inspection, final inspection, and packaging.

Optionally, after the bus bars are soldered on the cell strings, the EL inspection may be performed on the cells in the at least two cell strings at the stringing workstation, where two EL-energized electrodes are correspondingly pressed on the bus bars at both ends.

Optionally, the step of sending the image of the cell that needs to be repaired to the repair workstation may include:
  when a manufacturing workshop uses a manufacturing execution system (MES), sending the image of the cell that needs to be repaired to the MES, and sending the image of the cell that needs to be repaired to the repair workstation through the MES; and
  when the manufacturing workshop does not use the MES and uses a host to store the cell images and the cell inspection results, storing the image of the cell that needs to be repaired in the host shared by the stringing workstation and the repair workstation, where the host is connected to a plurality of display devices, a display device of the plurality of display devices is provided in the repair workstation, and the display device of the repair workstation directly displays the cell images stored in the host.

Optionally, after the step of delivering the front plate glass of carrying the cell modules to the repair workstation, the method may further include:
  calling out and displaying a cell image corresponding to the cell module by the repair workstation;
  determining, by a worker, whether the cell on the front plate glass needs to be repaired according to the displayed cell image and an actual cell;
  if it is determined by the worker that the cell on the front plate glass needs to be repaired, repairing the cell on the front plate glass, and after the cell is repaired, delivering the front plate glass of carrying the cell modules to the stacking workstation; and
  if it is determined by the worker that the cell on the front plate glass does not need to be repaired, directly delivering the front plate glass of carrying the cell modules to the stacking workstation.

Advantages of the Present Invention

Advantages

The EL inspection, the PL inspection and the appearance inspection are added in a cell string soldering process to automatically determine whether a cell is defective or not online. A defect frequency is set, and if the set value is exceeded, an alarm is given in time, such that a production status can be known in time to prevent the appearance of batch defective products. Information to be inspected mainly refers to images. By comparing an image with a standard failure image, in combination with intelligent AI technology, on-line high-speed continuous production and determination can be realized. That is, intelligent identification, determination, and management of failure risks are realized while high-speed manufacturing is realized, thereby getting rid of the requirements for on-line workers. Through the continuous repair and update of failure image information by workers offline, the continuous upgrade of intelligent AI is realized, thereby improving the reliability and accuracy. An image of a defective cell is fed back to a repair workstation, such that the image of the cell can be automatically called out at the repair workstation, which is convenient for a repair worker to check abnormalities on the cell, avoids errors in an operation process, simplifies an operation of the worker, and improves the repair speed of the worker.

In addition, the simultaneous soldering of a plurality of cell strings and the modularized module manufacturing process integrate and simplify the processes of single-string layout, fixing tape sticking among module strings, bus bar soldering, lead-out wire soldering, and the like in a traditional PV module manufacturing process, increases the manufacturing efficiency of a PV module, controls adverse conditions in a PV module manufacturing process, avoids the risk of batch failure, and promotes the overall PV module manufacturing to a level of intelligent AI closed loop, which improves a yield rate and reduces a total cost.

BRIEF DESCRIPTION OF THE DRAWINGS

Description of the Drawings

Figure 1:
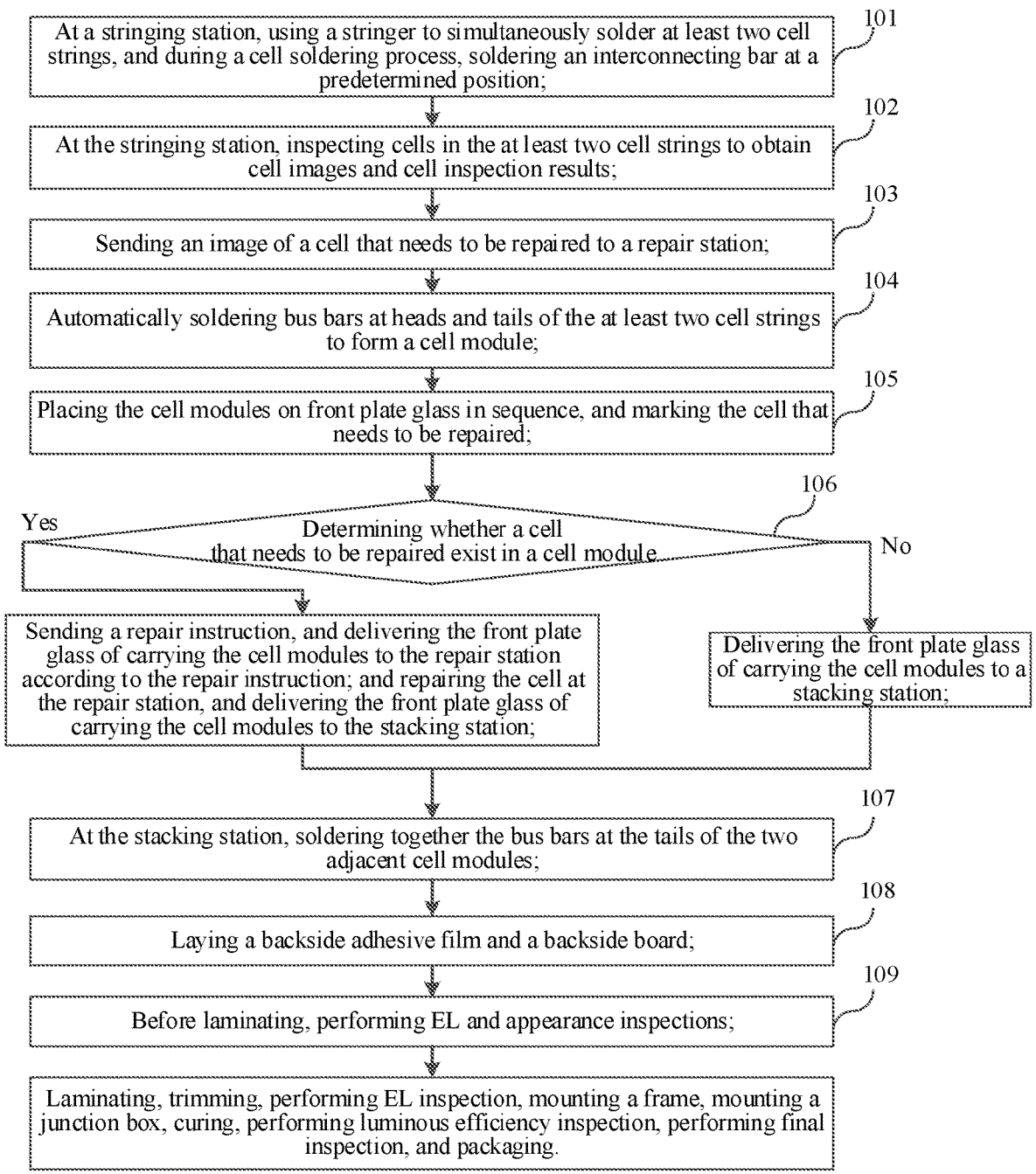
Figure 2:
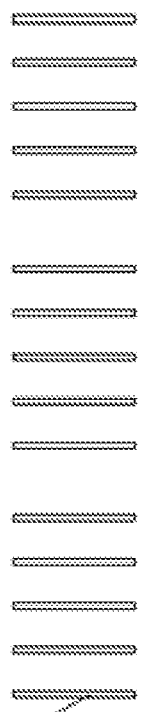
Figure 3:
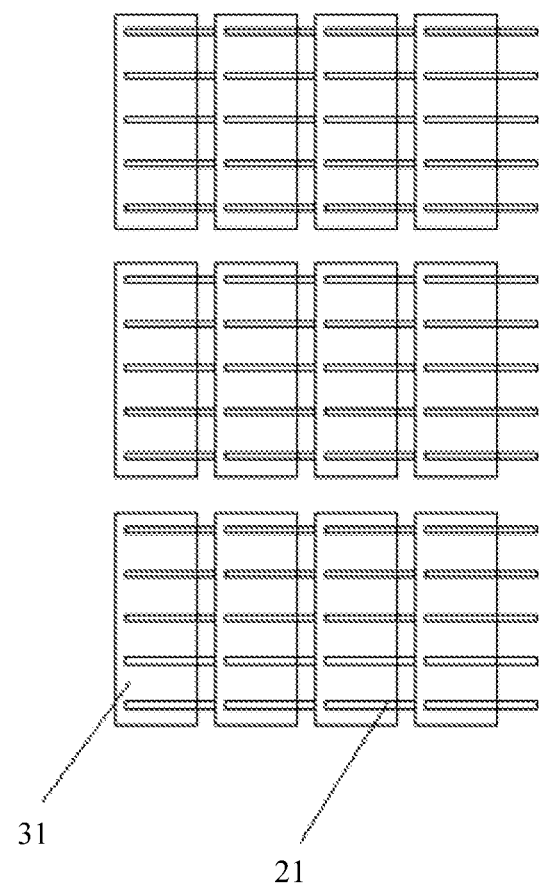
Figure 4:
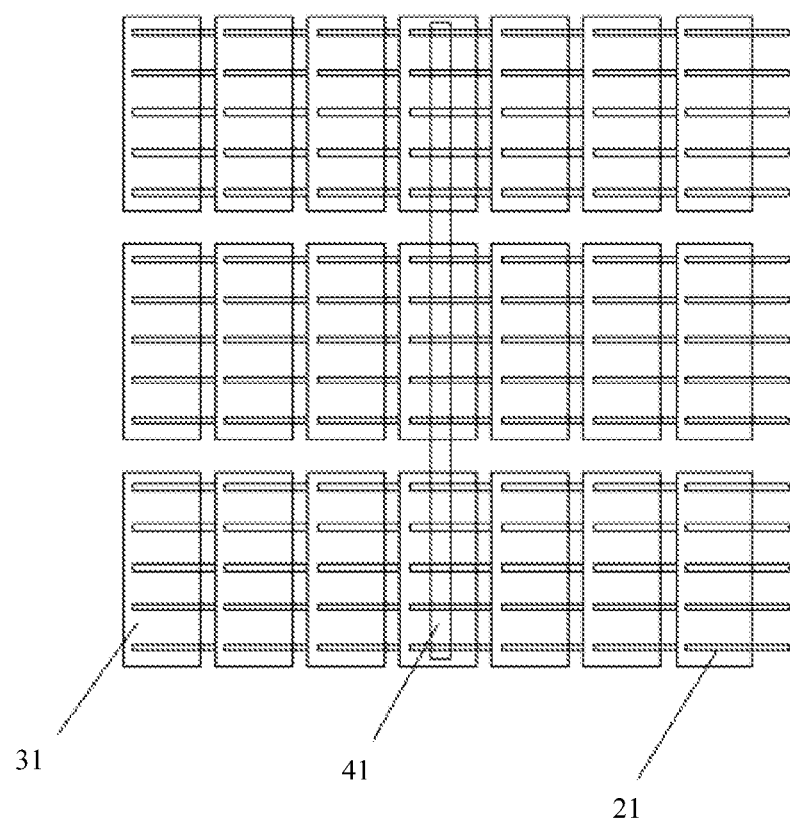
Figure 5:
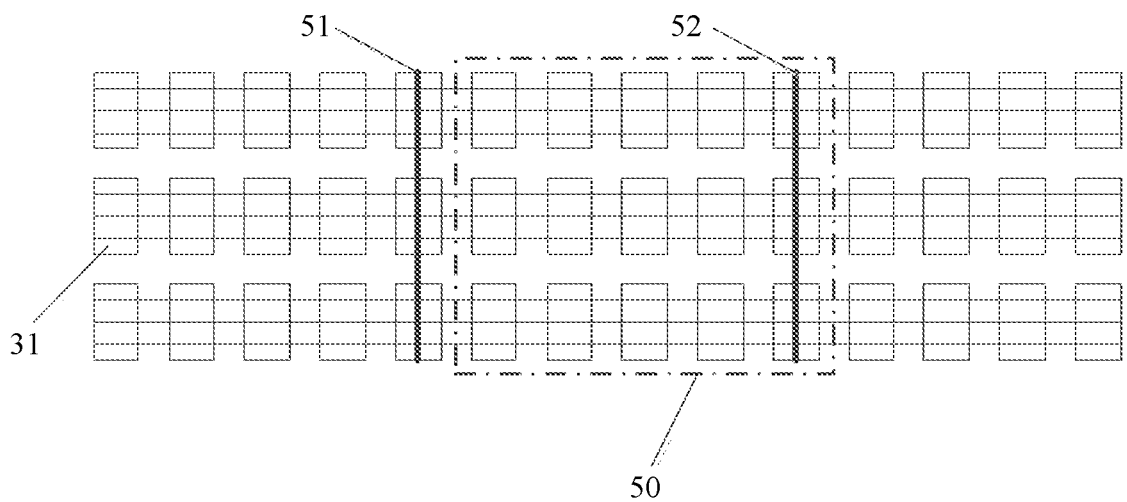
Figure 6:
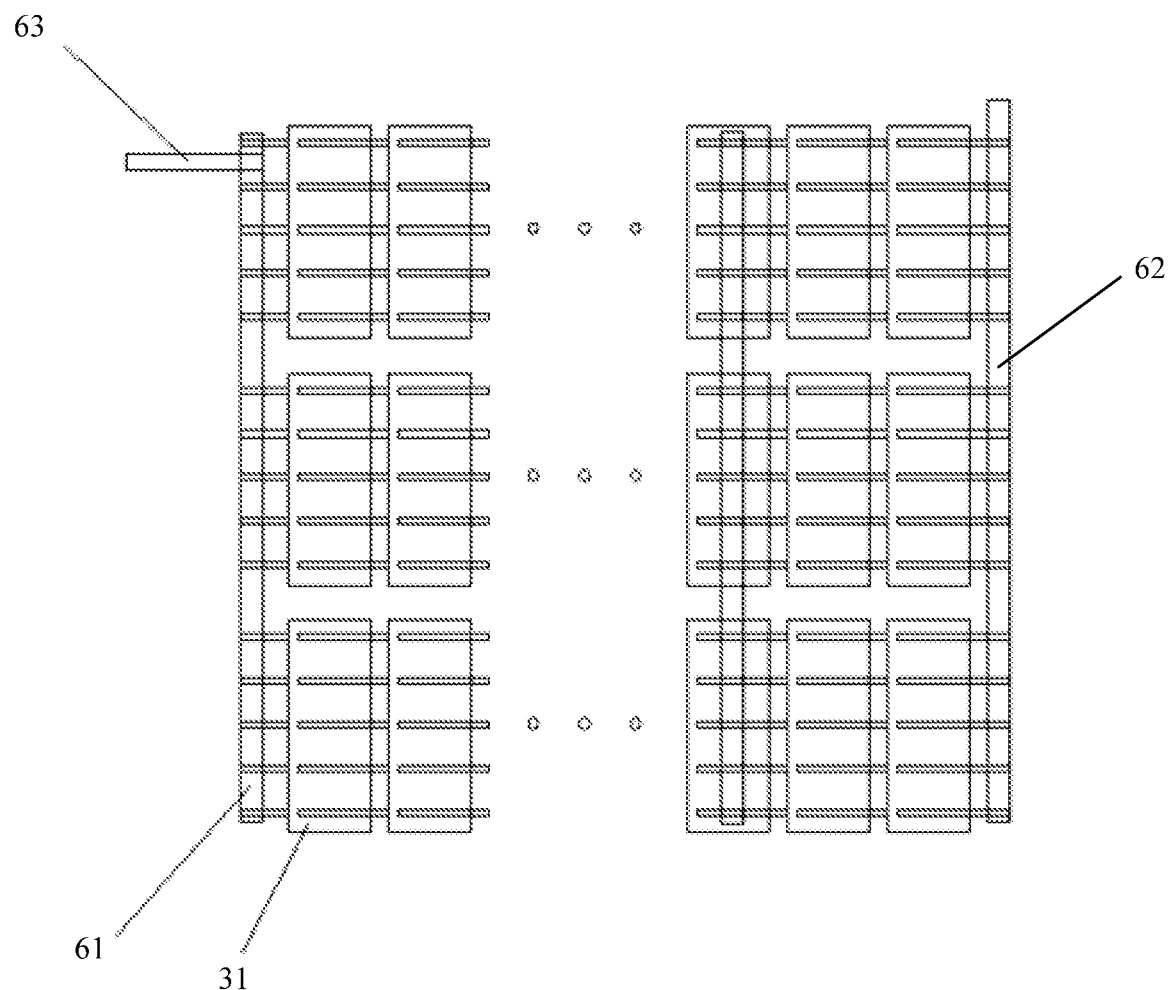
Figure 7:
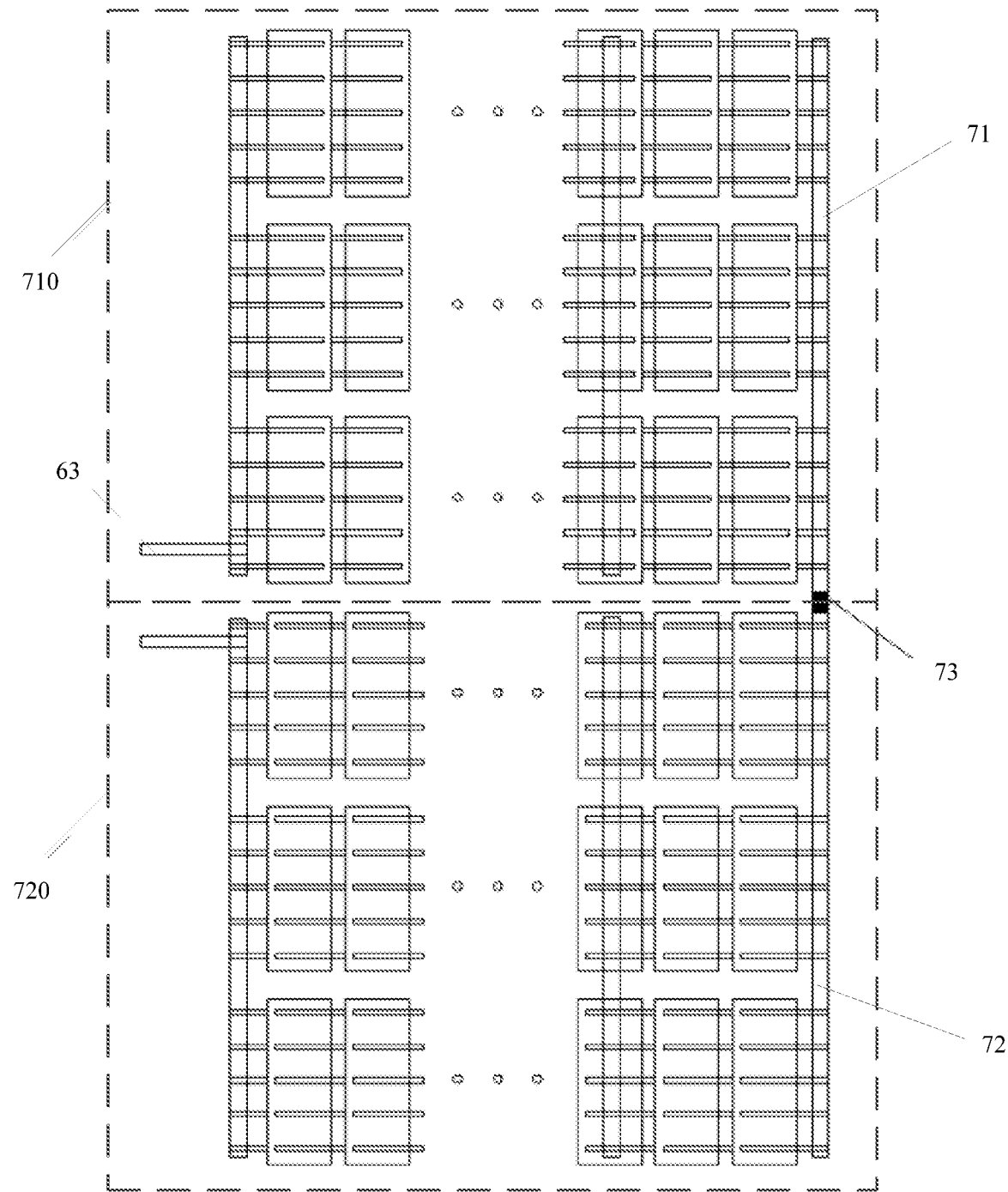

FIG. 1 is a flow chart of a method for manufacturing a PV module according to an exemplary embodiment;

FIG. 2 is a schematic diagram illustrating the arrangement of solder strips according to an exemplary embodiment;

FIG. 3 is a partial schematic diagram illustrating the soldering between cells and solder strips according to an exemplary embodiment;

FIG. 4 is a partial schematic diagram illustrating the simultaneous soldering of three cell strings according to an exemplary embodiment;

FIG. 5 is a schematic diagram illustrating three cell strings that are simultaneously soldered together according to an exemplary embodiment;

FIG. 6 is a schematic diagram illustrating cell modules according to an exemplary embodiment; and FIG. 7 is a schematic diagram illustrating the soldering between two cell modules according to an exemplary embodiment.

DETAILED DESCRIPTION OF THE EMBODIMENTS

Implementations of the Present Invention

In order to make the objectives, technical solutions, and advantages of the present invention clearer, implementations of the present invention will be further described in detail below with reference to the accompanying drawings.

FIG. 1 is a flow chart of a method for manufacturing a PV module according to an embodiment of the present invention. As shown in FIG. 1, the method for manufacturing a PV module can include the following steps:

Step 101: At a stringing workstation, a stringer is used to simultaneously solder at least two cell strings, and during a cell soldering process, an interconnecting bar is soldered at a predetermined position.

The interconnecting bar is configured to connect the at least two cell strings in parallel, for example, the interconnection bar is configured to connect three cell strings in parallel. The number and arrangement of the interconnecting bars are based on the design requirements of a PV module product, and there is no limitation on the interconnecting bar itself.

The stringer used to simultaneously solder the at least two cell strings is different from a conventional stringer which can only produce one cell string at a time.

Optionally, through the string soldering in combination with the existing PV module stereotype, three cell strings can be simultaneously produced.

Each cell string is composed of a plurality of cells that are connected through solder strips. Any two adjacent cells are connected through a solder strip, that is, a solder strip is connected to two cells, where half of the solder strip is located above a cell and the other half of the solder strip is below the other cell.

Optionally, the cells in cell strings may be any one from the group consisting of whole cells, ½ cells, ⅓ cells, ¼ cells, ⅕ cells, and ⅙ cells.

With the case where the stringer simultaneously solders three cell strings as an example, FIG. 2 shows the arrangement of the solder strips 21, and FIG. 3 shows the soldering between the cells 31 and the solder strips 21.

During a cell soldering process, when a cell needs to be soldered with an interconnecting bar, the interconnecting bar is placed at a predetermined position in advance and then soldered at the predetermined position. The predetermined position is determined in advance. For example, in each cell string, an interconnecting bar 41 needs to be soldered every three cells 31. As shown in FIG. 4, an interconnecting bar 41 connects three cell strings in parallel.

Step 102: At the stringing workstation, an inspection is performed on cells in the at least two cell strings to obtain cell images and cell inspection results.

The cell inspection results are used to determine whether a cell needs to be repaired.

The inspection includes an EL inspection and an appearance inspection or the inspection includes the EL inspection, a PL inspection and the appearance inspection.

Optionally, the stringing workstation may inspect some or all of the cells in the at least two cell strings.

During a cell soldering process, it is necessary to perform the EL inspection and the appearance inspection on cells in each cell string. Appearance inspection is performed to check whether foreign matters are adhered to a surface of a cell and to check whether a distance between cells meets design requirements. In the EL and appearance inspection processes, it is necessary to photograph the cells to obtain cell images of the cells.

In addition, PL inspection can be performed on the cells in each cell string to detect various potential defects inside the cells, such as crack, micro issue, or fragment on the cells.

PL inspection is performed by a PL inspection assembly of the stringing workstation. The PL assembly includes a laser assembly with a scanning light source and an infrared camera inspection assembly, and the two assemblies are provided in a space above a cell, and a working area of the infrared camera covers a corresponding cell. When the laser assembly with a scanning light source is working, the infrared camera starts exposure, PL occurs at a corresponding position on a cell scanned by the laser assembly with a scanning light source, and generated light is infrared light. The infrared camera continuously photographs. The continuous scanning and the continuous photographing lead to the formation of an overall image. The overall inspection process is achieved in a non-contact manner and thus will not cause damage to the cells, which can be used in the cell loading on a stringer or any stage of a stringing process.

In one case, in a cell string soldering process, when the $n^{th}$ cell is soldered, previous n−1 cells on each cell string are inspected to obtain cell images of the previous n−1 cells on each cell string, where n is an integer.

For example, when 3 cell strings are simultaneously soldered, for each cell string, after the 15th cell is soldered, the former 14 cells on each cell string are inspected to obtain cell images; and after the 29th cell is soldered, the 14th to 28th cells are inspected.

In another case, in a cell string soldering process, after an $n^{th}$ interconnecting bar is soldered, cells between an $(n-1)^{th}$ interconnecting bar and the $n^{th}$ interconnecting bar and a cell where the $n^{th}$ interconnecting bar is located are inspected. n is an integer.

For example, referring to FIG. 5, in a cell string soldering process, when three cell strings are simultaneously soldered, for each cell string, an interconnecting bar is soldered every 5 cells 31, and after the 3rd interconnecting bar 52 is soldered, cells between the 2nd interconnecting bar 51 and the 3rd interconnecting bar 52 and a cell where the 3rd interconnecting bar is located are inspected, that is, all cells in the module 50 are inspected to obtain cell images.

Optionally, a stringer may be used to perform the EL inspection and the appearance inspection on some or all of the cells in the at least two cell strings; or a stringer may be used to perform the EL inspection, the PL inspection and the appearance inspection on some or all of the cells in the at least two cell strings.

Optionally, the EL inspection may be performed after bus bars are soldered on the cell strings, where two EL-energized electrodes are correspondingly pressed on the bus bars at both ends, which can avoid direct physical contact with the cell and the risk of pressure damage to the cell.

Step 103: An image of the cell that needs to be repaired is sent to a repair workstation.

By analyzing inspection results of a cell, it can be determined whether the cell needs to be repaired.

In one case, when a manufacturing workshop uses an MES, the stringing workstation sends the image of the cell that needs to be repaired to the MES, and the image of the cell that needs to be repaired is sent to the repair workstation through the MES.

In another case, when the manufacturing workshop does not use the MES, but uses a host shared by the stringing workstation and the repair workstation to store the cell images and the cell inspection results, the host can be connected to a plurality of display devices, and a display device of the plurality of display devices is provided in the repair workstation, the display device of the repair workstation directly displays the cell images and the cell inspection results stored in the host.

Step 104: Bus bars are automatically soldered at heads and tails of the at least two cell strings to form a cell module.

The bus bars are configured to connect the heads and the tails of the at least two cell strings in parallel. In a string soldering process, the heads of the at least two cell strings from the stringer are connected in parallel through bus bars and the tails of the at least two cell strings are connected in parallel through bus bars to form a cell module. Each cell module has a default cell module label.

In one case, the soldering of a lead-out wire is completed at the stringing workstation. That is, at the stringing workstation, not only the heads and tails of the at least two cell strings are separately connected in parallel through bus bars, but also a lead-out wire is soldered on a bus bar at a head.

As shown in FIG. 6, the heads of the three cell strings from the stringer are connected in parallel through the bus bar 61, and the tails of the three cell strings are connected in parallel through the bus bar 62; after the bus bars are soldered at the heads and tails of the three cell strings, a cell module is formed; and then a lead-out wire 63 is soldered on the bus bar 61 at the head.

The soldering of the bus bar at the tail is automatically completed by a device, which reduces a labor cost.

It should be noted that the soldering of the lead-out wire may not be completed at the stringing workstation, or the lead-out wire may also be soldered at the stacking workstation.

Step 105: The cell modules are placed on front plate glass in sequence, and a cell that needs to be repaired is marked.

The front plate glass is placed on a conveyor belt by a glass feeder.

Optionally, during a feeding process of the front plate glass, a device may be used to spray or engrave a barcode, set an RFID label, or set a flow card with a barcode at a predetermined position on the front plate glass.

The barcode/RFID label is provided to identify the front plate glass. The predetermined position on the front plate glass is predetermined and can be adjusted according to actual conditions.

When the front plate glass is delivered to a layout workstation, the cell modules are placed on the front plate glass in sequence. A cell that needs to be repaired is marked.

Optionally, a back side of the cell that needs to be repaired may be marked.

Marking the cell that needs to be repaired can facilitate a repairer to find and repair the cell.

It should be noted that marking the cell that needs to be repaired can be performed before or after the cell modules are placed on the front plate glass in sequence.

Optionally, the front plate glass may be bound with the cell module. Specifically, a barcode/RFID label on the front plate glass is bound with the cell module label of the cell module to obtain a binding relationship between the front plate glass and the cell module.

After the front plate glass is bound with the cell module:
when the manufacturing workshop uses an MES, a binding relationship between the front plate glass and the cell module is uploaded to the MES; and
when the manufacturing workshop does not use the MES, but uses a host to store the cell images and cell inspection results, a binding relationship between the front plate glass and the cell module is uploaded to the host.

Optionally, a barcode may be sprayed on a cell module, and a maintainer can call out information of the cell module from the MES or the host through the barcode on the corresponding cell module.

It should be noted that a defective product placement zone is provided at the layout workstation. At the layout workstation, a cell module including a cell that needs to be repaired is preferentially placed in the defective product placement zone, and a cell module excluding a cell that needs to be repaired is preferentially placed on the front plate glass.

Step 106: It is determined whether the cell that needs to be repaired exists in the cell modules.

Optionally, it is determined by the worker whether the cell that needs to be repaired exists in the cell modules, that is, it is determined by the worker whether the cell module includes a cell with a repair mark.

Optionally, the MES or the host detects whether the cell that needs to be repaired exists in the cell modules according to a cell module label of the cell module; or, the MES or the host detects whether the cell that needs to be repaired exists in the cell modules according to a barcode/RFID label of front plate glass.

If the cell that needs to be repaired exists in the cell modules, a repair instruction is sent, and front plate glass of carrying the cell modules is delivered to the repair workstation according to the repair instruction.

After the front plate glass of carrying the cell modules including a cell that needs to be repaired is delivered to the repair workstation, a barcode or RFID label on the front plate glass or a barcode on a flow card set on the front plate glass is scanned by a scanner at the repair workstation, and a cell image corresponding to the cell module is called out from the MES or the host.

Optionally, the cell image corresponding to the cell module is called out by worker from the MES or the host according to the barcode/RFID label on the front plate glass; or the cell image corresponding to the cell module is automatically called out from the MES or the host by a device at the layout workstation according to the barcode/RFID label on the front plate glass. For example, the scanner at the repair workstation scans the barcode on the front plate glass to call out the cell image corresponding to the cell module from the MES or the host according to the barcode on the front plate glass.

After the cell image corresponding to the cell module is called out, the cell image corresponding to the cell module is displayed and it is determined by the worker whether a cell on the front plate glass needs to be repaired according to a displayed cell image and an actual cell.

If it is determined by the worker that the cell on the front plate glass needs to be repaired, the cell on the front plate glass is repaired; and after the cell is repaired, the front plate glass of carrying the cell modules is delivered by a conveyor belt to the stacking workstation.

If it is determined by the worker that the cell on the front plate glass does not need to be repaired, the front plate glass of carrying the cell modules is directly delivered by a conveyor belt to the stacking workstation.

If there is no cell that needs to be repaired in a cell module, the front plate glass of carrying the cell modules is delivered by a conveyor belt to the stacking workstation.

Step 107: At the stacking workstation, bus bars at tails of two adjacent cell modules are soldered together.

In one case, if a lead-out wire is soldered at the stringing workstation, at the stacking workstation, it only needs to solder together bus bars at tails of two adjacent cell modules.

In another case, if a lead-out wire is not soldered at the stringing workstation, at the stacking workstation, not only bus bars at tails of two adjacent cell modules need to be soldered together, but also a lead-out wire needs to be soldered on a bus bar at a head of each cell module.

As shown in FIG. 7, a bus bar 71 at a tail of a cell module 710 and a bus bar 72 at a tail of a cell module 720 are soldered together; a black zone 73 in FIG. 7 is a connection zone of the two cell modules; and a lead-out wire 63 is soldered on a bus bar at a head of each cell module.

After bus bars at tails of two adjacent cell modules are soldered together, the two adjacent cell modules are connected in series.

A general stacking process requires two workers. A worker at the head of the cell module will thread a lead-out wire, a worker at the tail of the cell module only needs to cooperate the laying, and thus the worker at the tail of the cell module has less workload. In the present invention, bus bars at tails of two adjacent cell modules are soldered together at the stacking workstation, the soldering of the bus bars is transferred to the tail, and thus bus bars at tails of two adjacent cell modules connected in series are soldered together by the worker at the tail of the cell module. Therefore, workloads of the workers at the head and tail are balanced, and labor hours are fully utilized. If the lead-out wire is soldered at the stacking workstation, the worker at the head of the cell module also needs to solder the lead-out wire on the bus bar at the head.

Step 108: A backside adhesive film and a backside board are laid.

A backside adhesive film and a backside board are laid on a cell module. A worker at a head of a cell module will threads a lead-out wire through the backside adhesive film and the backside board.

Step 109: Before laminating, the EL inspection and the appearance inspection are performed.

The the EL inspection and the appearance inspection before lamination are existing technologies and thus will not be repeated here.

After the the EL inspection and the appearance inspection are completed, laminating, trimming, the EL inspection, frame mounting, junction box mounting, curing, luminous efficiency inspection, final inspection, and packaging are performed to complete the manufacturing of the PV module.

In the method for manufacturing a PV module provided by the embodiment of the present invention, on-line EL/PL inspection and appearance inspection are added in a cell string soldering process to automatically determine whether a cell is defective or not online and feed a defective cell back to the repair workstation where a cell image of the cell can be called out from the MES, which is convenient for a repair worker to check abnormalities on the cell and avoids the case where batch products are unqualified because errors in the stringing process are discovered in the later procedures. Moreover, by displaying a cell image including adverse conditions of a cell, an operation of a worker is simplified and a repair speed of a worker is improved during a repairing process.

In addition, the simultaneous soldering of a plurality of cell strings and the modularized module manufacturing process integrate and simplify the processes of single-string layout, fixing tape sticking among module strings, bus bar soldering, lead-out wire soldering, and the like in a traditional PV module manufacturing process, increases the manufacturing efficiency of a PV module, controls adverse conditions in a PV module manufacturing process, avoids the risk of batch failure, and promotes the overall PV module manufacturing to a level of intelligent AI closed loop, which improves the manufacturing automation ability and the product yield rate and reduces a total cost.

It should be noted that the inspection of cells in a cell string can also be performed after the automatic soldering of bus bars at heads and tails of the at least two cell strings is completed. That is, the method for manufacturing the PV module is as follows: at a stringing workstation, a stringer is used to simultaneously solder at least two cell strings; after an interconnecting bar is soldered at a predetermined position during a cell soldering process, bus bars are automatically soldered at heads and tails of the at least two cell strings to form a cell module; all cells in the cell strings are inspected, an image of the cell that needs to be repaired is sent to a repair workstation; the cell modules are placed on front plate glass in order, and the cell that needs to be repaired is marked; and then it is determined whether the cell that needs to be repaired exists in the cell modules, and according to a determination result, the subsequent steps (namely, the above-mentioned steps 106 to 109) are performed.

It should be noted that the sequence numbers of the embodiments of the present invention are merely for the purpose of description and do not represent the superiority or inferiority of the embodiments.

The above descriptions are merely preferred embodiments of the present invention, and are not intended to limit the present invention. Any modifications, equivalent replacements, improvements, and the like made within the spirit and principle of the present invention shall be all included in the protection scope of the present invention.

What is claimed is:

1. A method for manufacturing a photovoltaic (PV) module, comprising:
   at a stringing workstation, using a stringer to simultaneously solder at least two cell strings, and during a cell soldering process, soldering an interconnecting bar at a predetermined position, wherein the interconnecting bar is configured to connect the at least two cell strings in parallel;
   at the stringing workstation, performing an inspection on cells in the at least two cell strings to obtain cell images and cell inspection results, wherein the cell inspection results are used to determine whether a cell needs to be repaired, and the inspection comprises an electroluminescence (EL) inspection and an appearance inspection or the inspection comprises the EL inspection, a photoluminescence (PL) inspection and the appearance inspection;
   sending an image of a cell that needs to be repaired to a repair workstation;
   automatically soldering bus bars at heads and tails of the at least two cell strings to form a cell module, wherein the bus bars are configured to connect the heads and the tails of the at least two cell strings in parallel;
   placing cell modules on a front plate glass in sequence, and marking the cell that needs to be repaired;
   determining whether the cell that needs to be repaired exists in the cell modules;
   when a defective cell that needs to be repaired exists in the cell modules, sending a repair procedure instruction, and delivering the front plate glass of carrying the cell modules to the repair workstation according to the repair procedure instruction;
   when the cell that needs to be repaired does not exist in the cell modules, delivering the front plate glass of carrying the cell modules to a stacking workstation;
   at the stacking workstation, soldering together bus bars at tails of two adjacent cell modules;
   laying a backside adhesive film and a backside board; and
   before laminating, performing the EL inspection and the appearance inspection.

2. The method according to claim 1, further comprising:
   when the bus bars are automatically soldered at the heads and the tails of the at least two cell strings, soldering a lead-out wire on a bus bar at a head.

3. The method according to claim 1, further comprising:
   at the stacking workstation, when the bus bars at the tails of the two adjacent cell modules are soldered together, soldering a lead-out wire on a bus bar at a head of each cell module.

4. The method according to claim 1, wherein the step of performing the inspection on the at least two cell strings comprises:
   in a cell string soldering process, when an $n^{th}$ cell is soldered, inspecting previous n−1 cells on each cell string, wherein n is an integer.

5. The method according to claim 1, wherein the step of performing the inspection on the at least two cell strings comprises:
   in a cell string soldering process, after an $n^{th}$ interconnecting bar is soldered, inspecting cells between an $(n-1)^{th}$ interconnecting bar and the $n^{th}$ interconnecting bar and a cell where the $n^{th}$ interconnecting bar is located.

6. The method according to claim 1, wherein the step of marking the cell that needs to be repaired comprises:
    after the cell modules are placed on the front plate glass in sequence, marking a back side of the cell that needs to be repaired;
    or, before the cell modules are placed on the front plate glass in sequence, marking a back side of the cell that needs to be repaired.

7. The method according to claim 1, wherein the cells in the cell strings are any one from the group consisting of whole cells, ½ cells, ⅓ cells, ¼ cells, ⅕ cells, and ⅙ cells.

8. The method according to claim 1, wherein the step of soldering together the bus bars at the tails of the two adjacent cell modules connected in series at the stacking workstation comprises:
    at the stacking workstation, soldering together the bus bars at the tails of the two adjacent cell modules connected in series by a tail worker.

9. The method according to claim 1, further comprising: laminating, trimming, the EL inspection, frame mounting, junction box mounting, curing, luminous efficiency inspection, final inspection, and packaging.

10. The method according to claim 1, wherein after the bus bars are soldered on the cell strings, the EL inspection is performed on the cells in the at least two cell strings at the stringing workstation, wherein two EL-energized electrodes are correspondingly pressed on the bus bars at both ends.

11. The method according to claim 1, wherein the step of sending the image of the cell that needs to be repaired to the repair workstation comprises:
    when a manufacturing workshop uses a manufacturing execution system (MES), sending the image of the cell that needs to be repaired to the MES, and sending the image of the cell that needs to be repaired to the repair workstation through the MES; and
    when the manufacturing workshop does not use the MES and uses a host to store the cell images and the cell inspection results, storing the image of the cell that needs to be repaired in the host shared by the stringing workstation and the repair workstation, wherein the host is connected to a plurality of display devices, a display device of the plurality of display devices is provided in the repair workstation, and the display device of the repair workstation directly displays the cell images stored in the host.

12. The method according to claim 1, after the step of delivering the front plate glass of carrying the cell modules to the repair workstation, further comprising:
    calling out and displaying a cell image corresponding to the cell module by the repair workstation;
    determining, by a worker, whether the cell on the front plate glass needs to be repaired according to the cell image and an actual cell;
    when the worker determines that the cell on the front plate glass needs to be repaired, repairing the cell on the front plate glass, and after the cell is repaired, delivering the front plate glass of carrying the cell modules to the stacking workstation; and
    when the worker determines that the cell on the front plate glass does not need to be repaired, directly delivering the front plate glass of carrying the cell modules to the stacking workstation.

\* \* \* \* \*